United States Patent [19]

Mizuta

[11] Patent Number: 5,202,852

[45] Date of Patent: Apr. 13, 1993

[54] PROGRAMMABLE READ ONLY MEMORY CARD WITH IMPROVED BUFFER CIRCUIT

[75] Inventor: Masaharu Mizuta, Itami, Japan

[73] Assignee: Mitsubishi Denki Kabushiki Kaisha, Tokyo, Japan

[21] Appl. No.: 713,560

[22] Filed: Jun. 10, 1991

Related U.S. Application Data

[63] Continuation of Ser. No. 372,777, Jun. 29, 1989, abandoned.

[30] Foreign Application Priority Data

Feb. 9, 1989 [JP] Japan .................................. 1-28596

[51] Int. Cl.$^5$ .............................................. G11C 7/00
[52] U.S. Cl. ............................ 365/189.01; 365/189.05; 235/492
[58] Field of Search ............... 365/52, 189.01, 189.03, 365/189.05, 185, 226, 195, 189.07, 189.09; 235/492

[56] References Cited

U.S. PATENT DOCUMENTS

| | | | |
|---|---|---|---|
| 4,845,351 | 7/1989 | Hara et al. ........................... | 235/492 |
| 4,910,710 | 3/1990 | Kobatake ........................ | 365/189.03 |
| 4,916,662 | 9/1988 | Mizuta ................................. | 365/52 |
| 5,016,223 | 5/1991 | Kimura et al. ...................... | 365/229 |

OTHER PUBLICATIONS

"IC Memory Card Guideline", pp. 1-33 (with translation of legends of figure on p. 10).
"Motorola High-Speed CMOS Integrated Circuits"; Series A, Second Printing, 1983, p. 5-233.

*Primary Examiner*—Joseph L. Dixon
*Assistant Examiner*—Jack A. Lane
*Attorney, Agent, or Firm*—Leydig, Voit & Mayer

[57] ABSTRACT

The read only memory card into which data can be written includes a bidirectional buffer connected to a data bus and a read/write control circuit which controls the direction of data transmission by the buffer. The control circuit determines whether data is to be written into or read from the memory based on the voltage on a writing power supply line and an output enable signal line. The electrostatic discharge resistance of the read only memory card is thereby at least ten times higher than that of the conventional memory card in which the data bus is directly connected to external equipment.

5 Claims, 5 Drawing Sheets

PROGRAMMABLE READ ONLY MEMORY CARD WITH IMPROVED BUFFER CIRCUIT

This application is a continuation of application Ser. No. 07/372,777, filed Jun. 29, 1989, now abandoned.

BACKGROUND OF THE INVENTION

1. Field of the Invention

This invention relates to a programmable IC card having a semiconductor memory, i.e., a PROM (programmable read only memory) card, in which data can be stored after the card has been assembled, and, more particularly, to the internal circuitry of the PROM card.

2. Description of Related Art

Generally, there are two types of IC memory cards: ROM cards and RAM cards, as described in "IC MEMORY CARD GUIDELINE" (issued September 1986) by the Personal Computer Business Committee of Japan Electrical Industry Development Association. ROM cards are separated into two groups: mask ROM cards in which data cannot be written after the card has been assembled; and OTP (one time programmable) memory cards or EPROM (electrically programmable read only memory) memory cards in which data can be written by using a writing device on the market called a PROM (programmable read only memory) writer after the card has been assembled. The difference between an OTP card and an EPROM card resides in whether or not rewriting is possible. OTP cards can only be programmed one time. The present invention will be described hereinafter with respect to OTP cards.

FIG. 1 shows a fundamental construction of an internal circuit of a conventional OTP card. The OTP card has an OTP memory 1 into which data can be written. To this memory are connected a power supply line [Vcc] 2 through which the memory 1 is supplied with power, a ground line [GND] 3, a write power supply line [Vpp] 4 for supplying power at the time of writing, an address bus [ADD] 5, a data bus [DATA] 6, a card enable control line or chip enable control line [$\overline{CE}$] 7 for controlling the operation of the memory 1, and an output enable control line [$\overline{OE}$] 8. These signal lines are combined at an input/output connector 9 and may be connected to, e.g., a terminal unit. The OTP card illustrated in FIG. 1 incorporates only one OTP memory and has a simple construction. However, the construction of a different OTP card incorporating a plurality of OTP memories is basically the same as the illustrated example. OTP memories having of 256 kilo-bit or 32 memory capacities, e.g., "M5L27C256" and M5L27C32" are most popularly used. The states of the input control signal lines at the time of reading and writing are as shown in Table 1:

TABLE 1

|  |  |  |  | (volt) |
|---|---|---|---|---|
| Operation | $\overline{CE}$ 7 | $\overline{OE}$ 8 | Vpp 4 | Vcc 2 |
| Read | VIL | VIL | 5 V | 5 V |
| Write | VIL | VIH | 12.5 V | 6 V |

VIL = 0 to 0.8 V
VIH = 2 to approximately Vcc V

That is, at the time of reading, the voltages of the card enable control line [$\overline{CE}$] 7 and the output enable control line [$\overline{OE}$] 8 are set to VIL (low level). In this state, an address is input through the address bus 5, and data read out then appears on the data bus 6. At the time of writing, the voltage of the output enable control line [$\overline{OE}$] 8 is set to VIH (high level), and the voltage of the write power supply line 4 is set to 12.5 V. In this state, an address is input through the address bus 5, data to be written is set on the data bus 6, and the level of the card enable control line [$\overline{CE}$] 7 is maintained at VIL for a certain period of time, thereby writing the data.

FIG. 2 is a flow chart of a process of writing in or reading from this OTP memory. In step S1 of FIG. 2, an address signal is set to the initial 0 address. In step S2, various control signals for data writing are prepared in accordance with Table 1. In step S3, data to be written is prepared and written. In step S4, whether or not the address is the final one is determined. If it is not the final address, the address is incremented by one in step S5, and the process returns to step S3. In step S6, the various control signals are prepared in accordance with Table 1 to read out data written in the OTP memory. In step S7, data corresponding to input addresses are read out in a random manner. In this flow chart, the steps S1 to S5 correspond to writing and the steps S6 and S7 correspond to reading. Thus, writing in and reading from the OTP memory are performed. It is of course possible to operate an IC memory card incorporating the OTP memory in the same manner.

The conventional ROM card in which data can be written is thus constructed, and the anti-electrostatic performance of the card, i.e., ESD (electrostatic discharge) resistance, is limited to that of the OTP memory. If a plurality of OTP memories are incorporated in an IC memory card, the OTP memories are connected to the data bus 6 in parallel with each other, and the fan-in/fan-out conditions are changed depending upon the number of OTP memories, i.e., the total memory capacity of the OTP memory card. As a result, the interface circuit becomes complicated.

SUMMARY OF THE INVENTION

In view of these problems, an object of the present invention is to provide a programmable ROM card which has a high ESD resistance, in which fan-in/fan-out conditions are constant irrespective of the memory capacity, in which the OTP memory interface circuit can be easily designed, and which is easy to use.

To this end, the present invention provides a ROM card having memory means including at least one programmable ROM in which data can be written, a connector for connection of the memory means to the equipment outside of the card, a plurality of input and output lines connected between the memory means and the connector, including a power supply line, a ground line, a write power supply line, an address bus, a data bus, a card enable control line and an output enable control line, a bidirectional buffer circuit connected to the data bus, and a read/write control circuit for supplying a directional control signal to the bidirectional buffer circuit after determining whether data are to be written in or read from the memory means on the basis of at least the voltages present on the output enable control line and the write power supply line.

In the programmable ROM card in accordance with the present invention, the read/write control circuit determines whether writing or reading is carried out on the basis of inputs including the voltages of the write power supply line and the output enable signal line, and supplies the directional control signal to the bidirectional buffer circuit to control its direction of operation.

DESCRIPTION OF THE PREFERRED EMBODIMENTS

Figure 1:
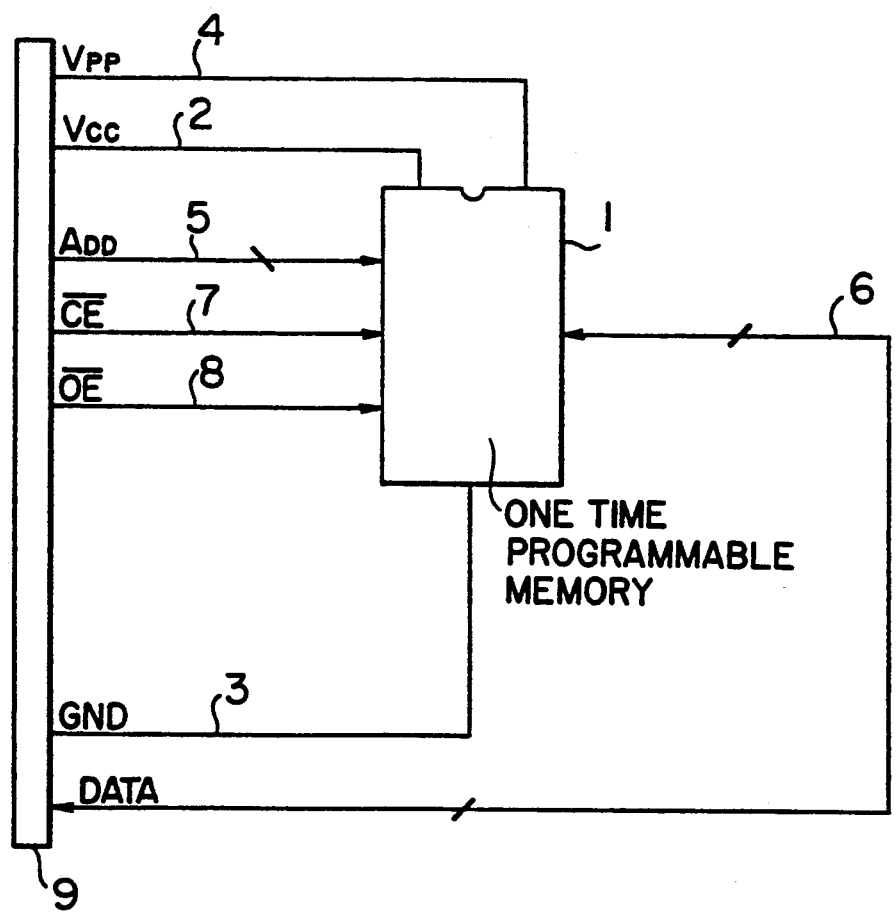
FIG. 1 is a block diagram of the internal construction of a conventional programmable ROM card in which data can be written.
Figure 2:
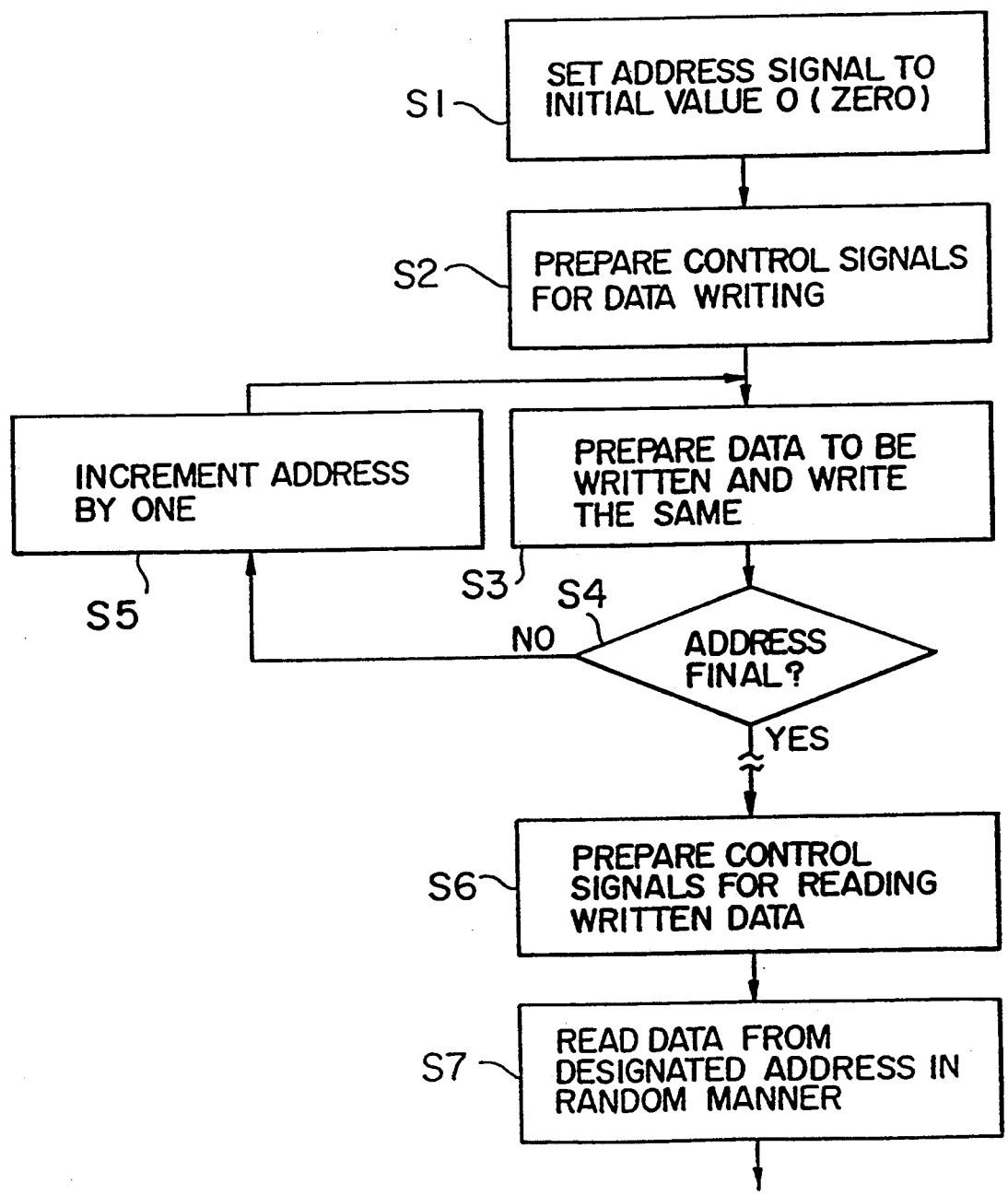
FIG. 2 is a flow chart of a procedure of writing data into and reading data from an OTP memory.
Figure 3:
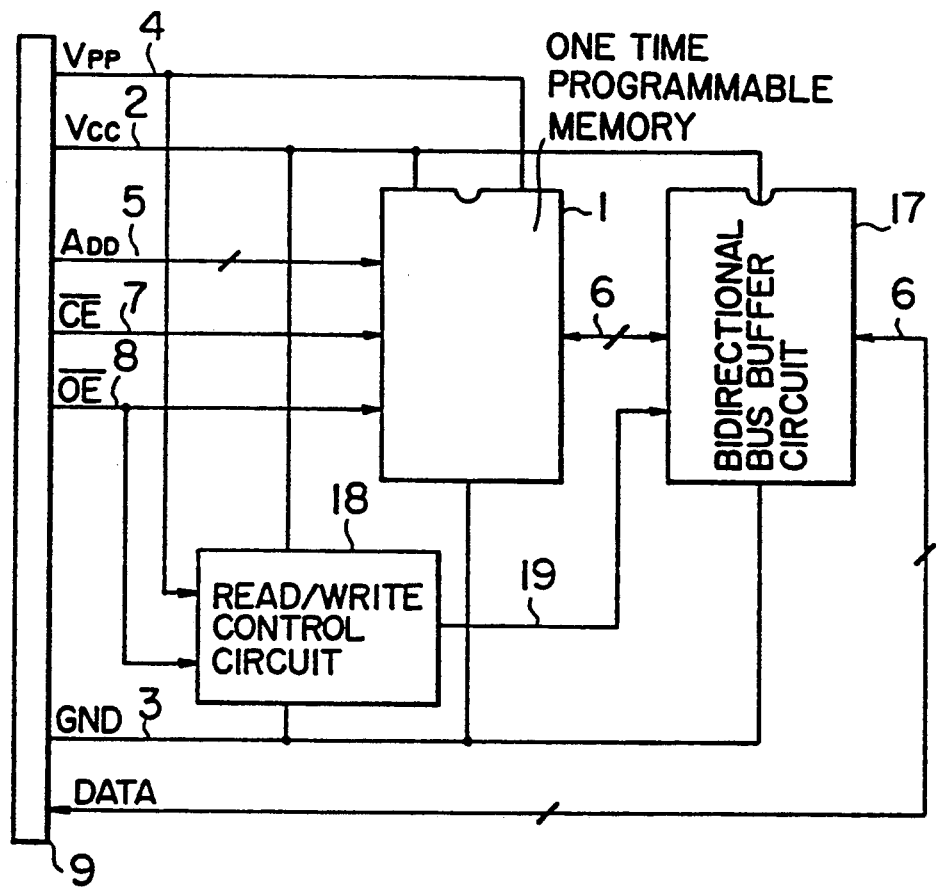
FIG. 3 is a block diagram of the internal construction of a programmable ROM card in accordance with the present invention in which data can be written.

Embodiments of the present invention will be described below with reference to the accompanying drawings. FIG. 3 is a circuit diagram of a programmable ROM card or, more specifically, an OTP card in accordance with the present invention. In FIG. 3, components identical to those shown in FIG. 1 are indicated by the same reference characters. A bidirectional buffer circuit 17 inserted in a data bus 6 is, for example, a model 74HC245 bus transceiver integrated circuit a first data port and a second data port and a directional control terminal. A read/write control circuit 18 outputs a directional control signal to the bidirectional buffer circuit 17 through a directional control signal line 19 in accordance with the conditions shown in Table 1 by detecting the voltages of write power supply line [Vpp] 4 and output enable control line [$\overline{OE}$] 8. The read/write control circuit 18 may be a logic circuit. The bidirectional buffer circuit 17 when a model 74HC245 integrated circuit has a pair of groups of input/output ports each including eight bidirectional input/output ports. The direction of the buffer circuit 17 is changed over in rapid response to a change-over of the signal on the bidirectional control signal line 19 between VIL (low level) and VIH (high level). The ESD resistance of a model 74HC145 integrated circuit is several thousands of volts which is about 10 times higher than ESD resistance of the OTP memory 1 which is of several hundreds of volts. Thus, the programmable memory 1 can withstand an ESD voltage up to a first magnitude without damage, and the model 74HC245 bidirectional bus buffer circuit can withstand an ESD voltage up to a second magnitude without damage, the second magnitude being about ten times larger than the first magnitude.

Figure 4:
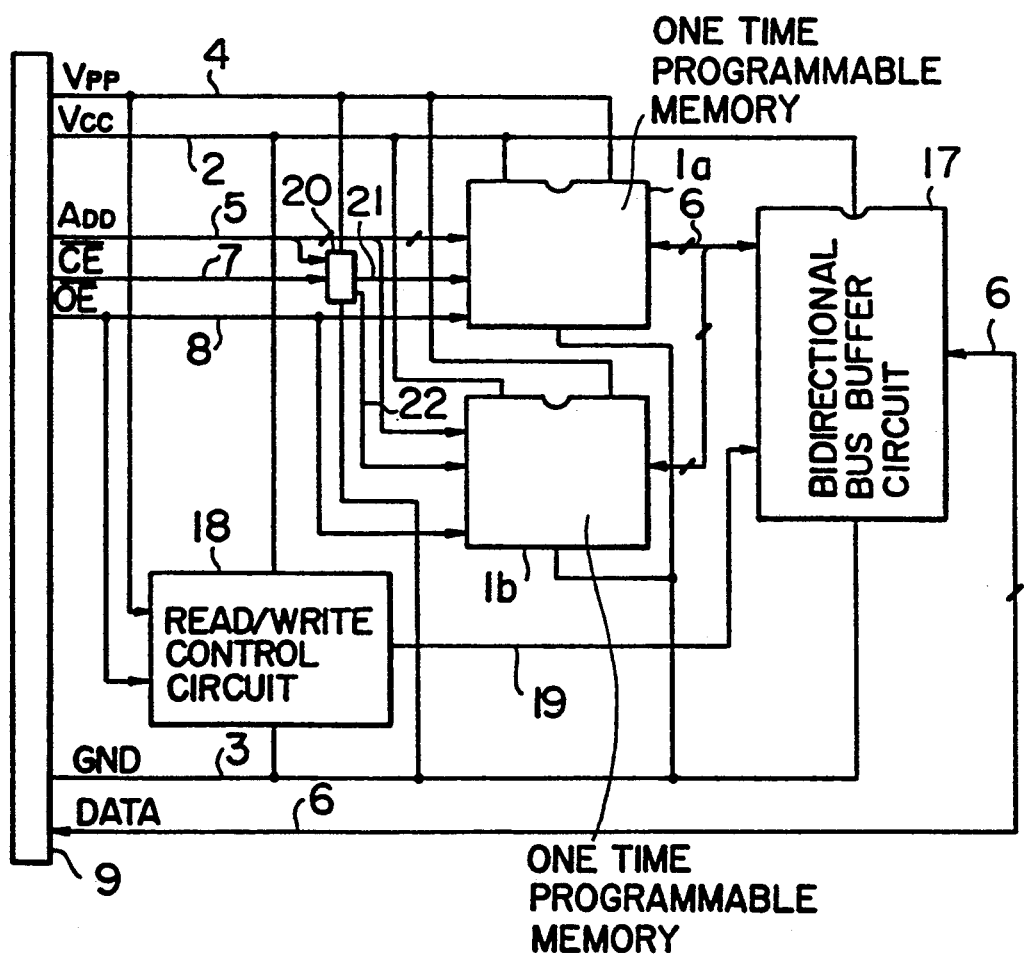
FIG. 4 is a block diagram of the internal construction of another programmable ROM card having a plurality of ICs in accordance with the present invention.

FIG. 4 shows another circuit arrangement in a case where a plurality of OTP memories are provided to increase the memory capacity. In this case also, it is sufficient to provide only one bidirectional buffer circuit 17. The connection between the buffer circuit 17 and the input/output connector 9 is the same as the case where only one OTP memory is used while the plurality of OTP memories (1a and 1b) and the buffer circuit 17 are connected by common bus wiring. In this arrangement, a chip selection circuit 20 is provided for selecting one of the OTP memories 1a and 1b. The chip selection circuit 20 can transmit a chip enable signal to each of the OTP memories 1a and 1b through chip enable control lines 21 and 22 in response to a signal on the card enable control line [$\overline{CE}$] 7 and a higher-order address on the address bus 5. This operation will not be described in detail. Conventionally, needless to say, use of buffers for increasing the ESD resistance has contributed to the design of practical IC memory cards. That is, in a RAM card, buffer circuits are disposed in the address bus or the like on the input side of the memory chip and in the data bus or the like on the output side. In a mask ROM card in which no data can be written, buffers are provided in the same manner as the RAM card. In an OTP card in which data can be written, a buffer is disposed on the input side alone.

Figure 5:
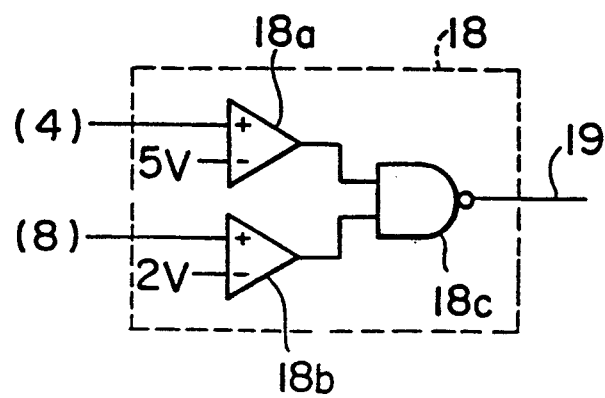
FIG. 5 is a block diagram of the internal construction of the read/write control circuit shown in FIGS. 3 and 4.

Ordinarily, to write, the read/write control circuit 18 supplies a directional control signal 19 at a low level to the buffer circuit 17, thereby enabling transmission of data which is to be written from the input/output connector 9 to the OTP memory 1. Also, to read, the read/write control circuit 18 supplies a directional control signal 19 at a high level, thereby enabling transmission of read data from the OTP memory 1 to the input/output connector 9. The read/write control circuit 18 is, for example, first and second differential amplifiers 18a and 18b and a NAND circuit 18c, as shown in FIG. 5 in which the internal construction of the read/write control circuit 18 is illustrated. The write power supply line 4 is connected to one of a pair of input terminals of the first differential circuit 18a, and a reference voltage of 5 V is supplied to the other terminal. The output enable control line 8 is connected to one of a pair of input terminals of the second differential amplifier 18b, and a reference voltage 2 V is applied to the other terminal. Output terminals of the first and second differential amplifiers 18a and 18b are connected to input terminals of the NAND circuit 18c. The output signal from the NAND circuit 18c is used as the directional control signal 19. Writing is enabled, in accordance with Table 1, when the level of the output enable control line 8 is at VIH (equal to or higher than 2 V) and the level of the write power supply line 4 is at about 12.5 V (actually, equal to or higher that 5 V). The differential amplifiers 18a and 18b detect these levels and output the directional control signal 9 at the level VIL to the bidirectional buffer circuit 17 if both the conditions are satisfied.

Figure 6:
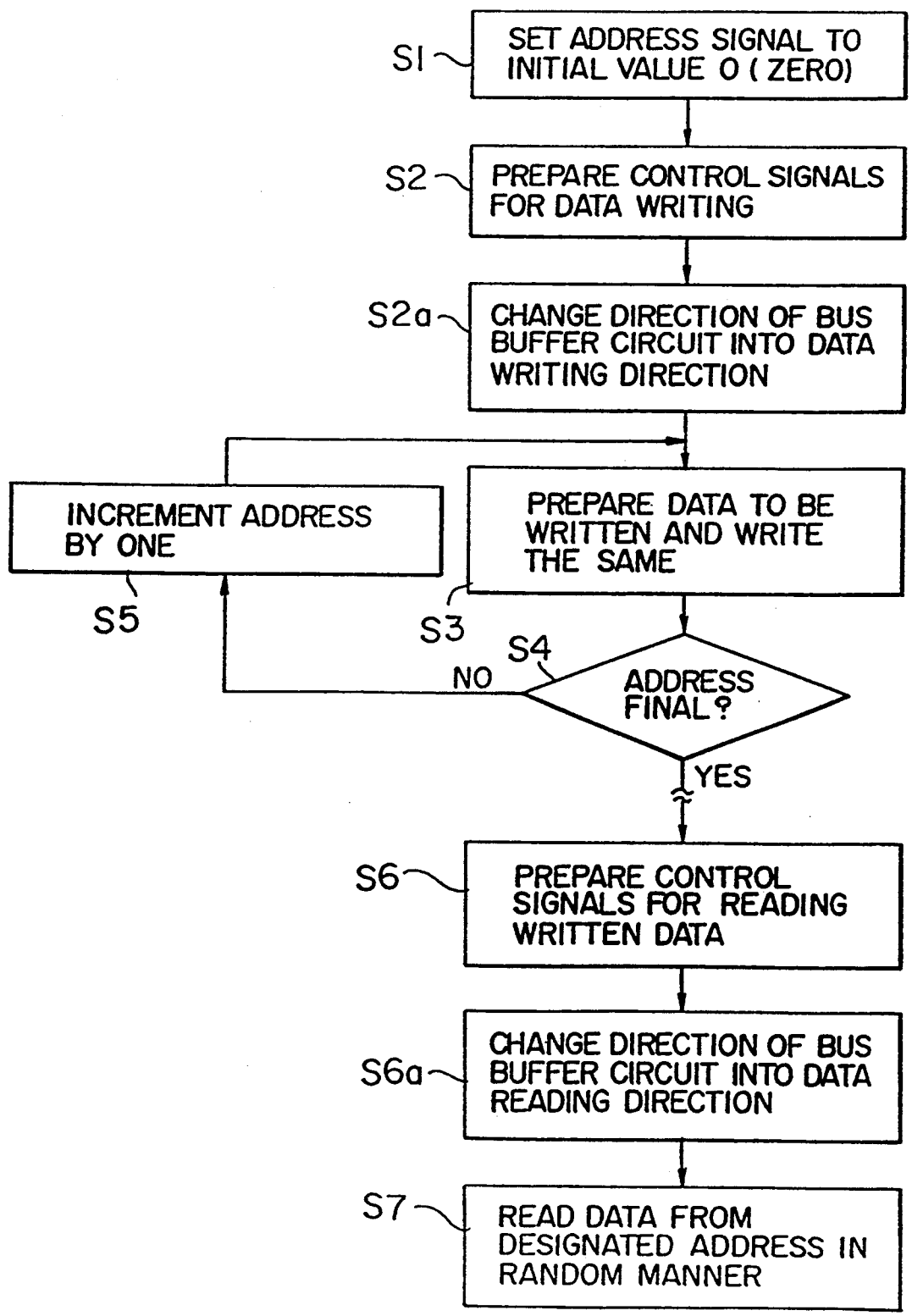
FIG. 6 is a flow chart of a procedure of writing in and reading from the programmable ROM cards shown in FIGS. 3 and 4.

FIG. 6 shows a flow chart for writing data into and reading data from the OTP card in accordance with the present invention. The flow of FIG. 6 differs from that of the conventional reading and writing operations with respect to the following points. In step S2a, between S2 and S3 for the writing operation, the direction of the buffer circuit 17 is changed to the direction for writing data into the OTP memory 1. In step S6a, between steps S6 and S7, the direction of the buffer circuit 17 is changed to the direction for reading data from the OTP memory 1.

In the above-described embodiments, the output enable control line 8 and the write power supply line 4 are selected for determining the condition input to the read/write control circuit 18. However, other conditions based on, for example, the voltage of the signal on the card enable control line 7 and the power supply voltage of the power supply line 2 may be added.

Each of the programmable ROM cards shown in FIGS. 3 and 4 may be constituted by a single chip, or the memory section and other sections may respectively be formed in two chips.

In accordance with the present invention, as described above, a bidirectional bus buffer circuit is inserted in the data bus of the programmable ROM card in which data can be written, and a read/write control circuit which supplies a directional control signal to the bidirectional buffer circuit after determining whether writing or reading is to be performed by detecting the voltages of control lines, i.e., the writing power supply line and the output enable signal line or the power supply voltage of the power supply line. The ESD resistance thereby becomes at least ten times higher than that of the conventional memory card in which the data bus is directly led to the outside of the card. In addition, conditions for an interface circuit between the card and a user application circuit (e.g., a terminal unit) can be determined irrespective of the memory capacity. Thus, a programmable ROM card which is easy to design as well as easy to use can be provided.

What is claimed is:

1. A programmable read only memory card comprising:

memory means, including at least one programmable read only memory having an external data port that can withstand an electrostatic discharge up to a first magnitude without damage, for storing data written into said memory means;

a connector for electrical connection of said programmable read only memory card to external circuitry;

distinct input and output lines connected between said memory means and said connector including a power supply line for supplying power to said programmable read only memory card, a ground line for connection to an electrical ground, a write power supply line for supplying power during writing in said memory means, an address bus for supplying an address for reading data from and writing data into said memory means, a data bus for supplying data to and transmitting data from said programmable read only memory card, a card enable control line for controlling operation of said programmable read only memory card, and an output enable control line for controlling output of data from said programmable read only memory card;

a bidirectional buffer circuit connected to said data bus for selectively enabling transmission of data to said at least one programmable read only memory for writing data into said at least one programmable read only memory and transmission of data from said at least one programmable read only memory in response to a directional control signal, said bidirectional buffer circuit withstanding an electrostatic discharge up to a second magnitude without damage, the second magnitude exceeding the first magnitude; and a read/write control circuit connected to said output enable control line and said write power supply line for controlling writing of data into and reading of stored data from said at least one programmable read only memory in response to the voltages on said output enable control line and said write power supply line and for generating the directional control signal supplied to said bidirectional buffer circuit in response to the voltages of said output enable control line and said write power supply line, said read/write control circuit including:

a first differential amplifier having a first input connected to the write power supply line and a second input connected to a first reference voltage, the first differential amplifier generating an output signal indicative of a difference between the voltage on the write power supply line and the reference voltage; and control logic means connected to said output enable control line and receiving the output signal from said first differential amplifier for outputting the directional control signal in response to the voltage on the output enable control line and the output signal.

2. A programmable read only memory card according to claim 1 wherein 8-bit data is written into said at least one programmable read only memory, said bidirectional buffer circuit has a directional control terminal and a pair of input/output ports, each input/output port including eight bidirectional ports, said read/write control circuit outputting the direction control signal supplied to said directional control terminal and designating reading when the conditions for writing are not satisfied.

3. A programmable read only memory card according to claim 2 wherein said control logic means includes a second differential amplifier having a first input connected to said output enable line and a second input connected to a second reference voltage and a NAND circuit receiving output signals from said first and second differential amplifiers for outputting the directional control signal.

4. A programmable read only memory card according to claim 1 wherein said at least one programmable read only memory and said bidirectional buffer and read/write control circuits are formed in a single chip.

5. A programmable read only memory card according to claim 1 comprising two chips in which said at least one programmable read only memory and said bidirectional buffer and read/write control circuits are respectively formed.

* * * * *